United States Patent
Cheng et al.

(10) Patent No.: US 11,442,485 B2
(45) Date of Patent: Sep. 13, 2022

(54) INTEGRATED CIRCUIT CHIP AND TEST METHOD THEREOF

(71) Applicant: Novatek Microelectronics Corp., Hsinchu (TW)

(72) Inventors: Yi-Hsuan Cheng, Hsinchu (TW); Ying-Chung Tseng, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 21 days.

(21) Appl. No.: 16/924,227

(22) Filed: Jul. 9, 2020

(65) Prior Publication Data

US 2022/0011803 A1     Jan. 13, 2022

(51) Int. Cl.
*G05F 3/26* (2006.01)
*H01L 23/50* (2006.01)
*H01L 23/498* (2006.01)

(52) U.S. Cl.
CPC ............ *G05F 3/262* (2013.01); *H01L 23/498* (2013.01); *H01L 23/50* (2013.01)

(58) Field of Classification Search
None
See application file for complete search history.

(56) References Cited

U.S. PATENT DOCUMENTS

| | | | | |
|---|---|---|---|---|
| 6,917,192 B1* | 7/2005 | Xin-LeBlanc | ........ | H03L 7/0895 327/148 |
| 6,940,767 B2* | 9/2005 | Ooishi | .................... | G11C 29/02 365/201 |
| 7,145,929 B2* | 12/2006 | Bergmann | .............. | G05F 3/265 372/38.07 |
| 7,781,861 B2* | 8/2010 | Mori | .................... | H01L 23/5256 257/E23.149 |
| 9,166,531 B2* | 10/2015 | Iijima | .................... | H03F 1/0233 |
| 2013/0027053 A1* | 1/2013 | Lee | ..................... | G01R 31/2884 324/98 |
| 2021/0090679 A1* | 3/2021 | Tran | .................. | G11C 29/50008 |
| 2021/0208618 A1* | 7/2021 | Ji | ............................. | G05F 1/561 |
| 2021/0270870 A1* | 9/2021 | Chen | .................. | G01R 19/0092 |

* cited by examiner

*Primary Examiner* — Thomas J. Hiltunen
*Assistant Examiner* — Khareem E Almo
(74) *Attorney, Agent, or Firm* — JCIPRNET (57) ABSTRACT

An integrated circuit chip and test method thereof are provided. The integrated circuit chip of the disclosure includes a first chip circuit and a plurality of external pins. The first chip circuit includes a plurality of first internal pads, a plurality of second internal pads and a current mirror circuit. The current mirror circuit is coupled to one of the plurality of first internal pads and the plurality of second internal pads. The plurality of external pins are coupled to the plurality of first internal pads.

21 Claims, 8 Drawing Sheets

INTEGRATED CIRCUIT CHIP AND TEST METHOD THEREOF

BACKGROUND

Technical Field

The disclosure relates to a circuit design, and particularly relates to an integrated circuit chip and a test method thereof.

Description of Related Art

In general, the integrated circuit chip manufactured by a multi-chip module (MCM) packet processing technology may include a plurality of chip circuits (also referred to as dies), and each of the chip circuits may include a plurality of pads. The pads of each of the chip circuits in the integrated circuit chip may couple each other through a plurality of traces. In this regard, due to the packaging process error, the integrated circuit chip may have an internal trace short (such as micro short or direct short), a power pad short or a ground pad short. Thus, after the chip packaging process, the integrated circuit chip should be performed a chip defect test. However, the traditional chip defect test may involve complex function operation or detect all the input output pins of the integrated circuit chip, but it is still cannot effectively detect the internal trace short between the chip circuits, the power pad short or the ground pad short. Therefore, regarding how to perform effective defect test on the integrated circuit chip, solutions of several embodiments are provided below.

SUMMARY

The disclosure is directed to an integrated circuit chip and a test method thereof, and is capable of performing effective defect test on the integrated circuit chip.

The integrated circuit chip of the disclosure includes a first chip circuit and a plurality of external pins. The first chip circuit includes a plurality of first internal pads, a plurality of second internal pads and a current mirror circuit. The current mirror circuit is coupled to one of the plurality of first internal pads and the plurality of second internal pads. The plurality of external pins are coupled to the plurality of first internal pads.

The integrated circuit chip of the disclosure includes a first chip circuit and a plurality of external pins. The first chip circuit includes a plurality of first internal pads, a plurality of second internal pads and a current sensor circuit. The current sensor circuit is coupled to one of the plurality of first internal pads and the plurality of second internal pads. The plurality of external pins are coupled to the plurality of first internal pads.

The test method of the disclosure is adapted to an integrated circuit chip. The integrated circuit chip includes a first chip circuit, a second chip circuit and a plurality of external pins. A plurality of first internal pads of the first chip circuit are coupled to the plurality of external pins. A plurality of second internal pads of the first chip circuit are coupled to a plurality of third internal pads of the second chip circuit through a plurality of internal traces. A current mirror circuit in the first chip circuit is coupled to one of the plurality of first internal pads and the plurality of second internal pads. The test method includes the following steps: selectively and individually operating the plurality of second internal pads in an input state or an output state, and outputting a current to one of the plurality of external pins through the one of the plurality of first internal pads by the current mirror circuit mirroring and summing a plurality of currents transmitted by the plurality of second internal pads; and detecting the current transmitted by the one of the plurality of external pins to determine whether the integrated circuit chip is defective.

The test method of the disclosure is adapted to an integrated circuit chip. The integrated circuit chip includes a first chip circuit, a second chip circuit and a plurality of external pins. A plurality of first internal pads of the first chip circuit are coupled to the plurality of external pins. A plurality of second internal pads of the first chip circuit are coupled to a plurality of third internal pads of the second chip circuit. A current sensor circuit in the first chip circuit is coupled to one of the plurality of first internal pads and the plurality of second internal pads. The test method includes the following steps: selectively and individually operating the plurality of second internal pads in an input state or an output state, and outputting a voltage to one of the plurality of external pins through the one of the plurality of first internal pads by the current sensor circuit sensing the plurality of second internal pads; and detecting the voltage provided by the one of the plurality of external pins to determine whether the integrated circuit chip is defective.

Based on the above, according to the integrated circuit chip and the test method thereof of the disclosure, the integrated circuit chip can be effectively tested to determine whether the internal circuit of the integrated circuit chip has the internal trace short between the chip circuits, the power pad short or the ground pad short.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

It is to be understood that other embodiments may be utilized and structural changes may be made without departing from the scope of the disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
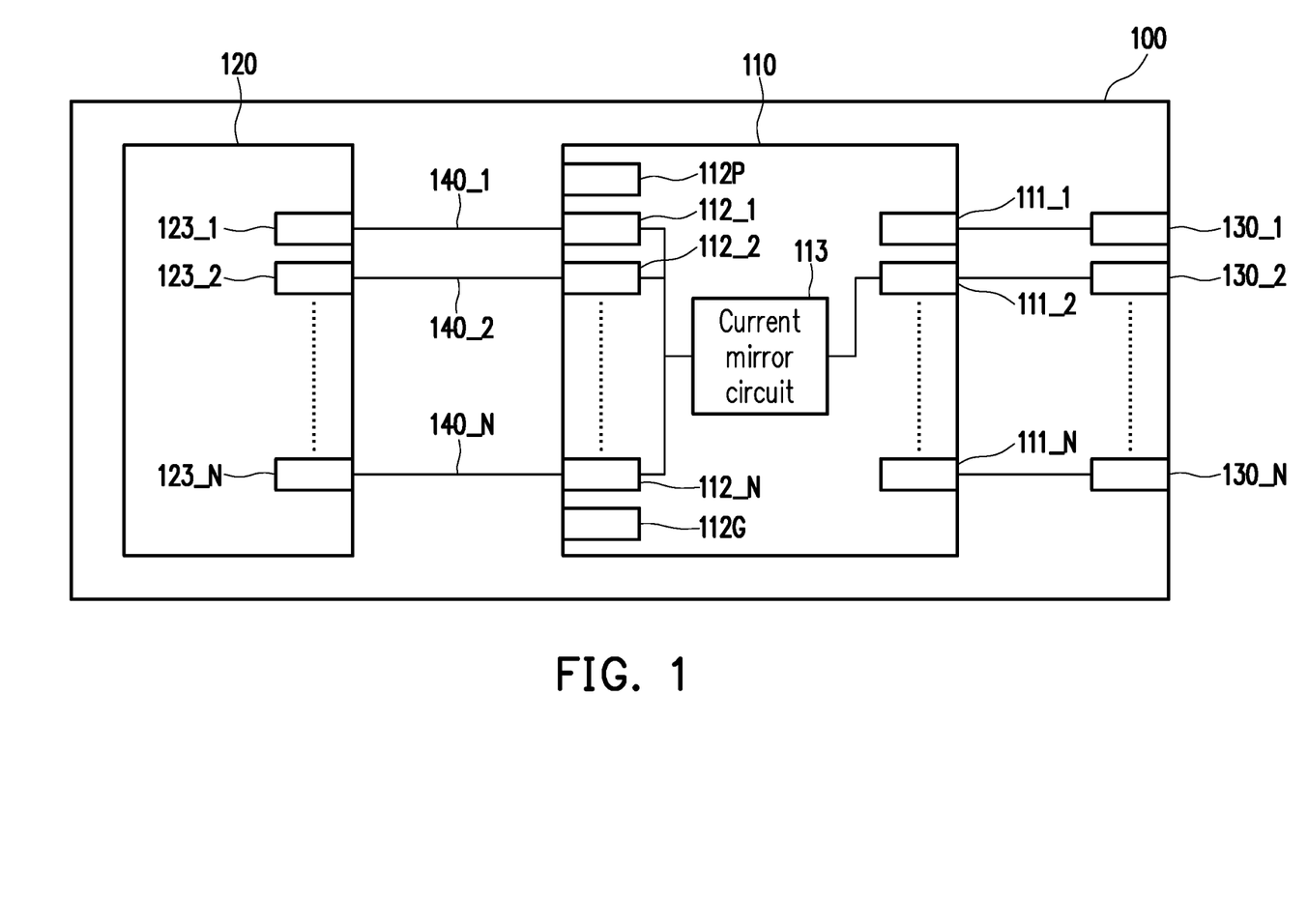
FIG. 1 is a schematic diagram illustrating an integrated circuit chip according to an embodiment of the disclosure.

FIG. 1 is a schematic diagram illustrating an integrated circuit chip according to an embodiment of the disclosure. Referring to FIG. 1, the integrated circuit chip 100 includes a first chip circuit 110, a second chip circuit 120, and a plurality of external pins 130_1~130_N, wherein N is a positive integer. The first chip circuit 110 includes a plurality of first internal pads 111_1~111_N, a plurality of second internal pads 112_1~112_N, a power pad 112P, a ground pad 112G and a current mirror circuit 113. In the embodiment of the disclosure, the current mirror circuit 113 is coupled to the first internal pad 111_2 and the second internal pads 112_1~112_N, but the disclosure is not limited thereto. In some embodiments of the disclosure, the current mirror circuit 113 may be coupled to at least one of the first internal pads 111_1~111_N. In the embodiment of the disclosure, the first internal pads 111_1~111_N are one-to-one coupled to the external pins 130_1~130_N. The second chip circuit 120 includes a plurality of third internal pads 123_1~123_N, and the second internal pads 112_1~112_N are one-to-one coupled to the third internal pads 123_1~123_N through a plurality of traces 140_1~140_N.

In one embodiments of the disclosure, the integrated circuit chip 100 may be manufactured by a multi-chip module (MCM) packet processing technology, thus the internal of the integrated circuit chip 100 may include a plurality of traces for connecting a plurality of chip circuits. In some embodiments of the disclosure, the integrated circuit chip 100 may be a display driver chip. The first chip circuit 110 may include a display driver circuit, and the second chip circuit 120 may include a memory circuit, such as a static random-access memory (SRAM). However, the disclosure is not limited as the above example.

Figure 2:
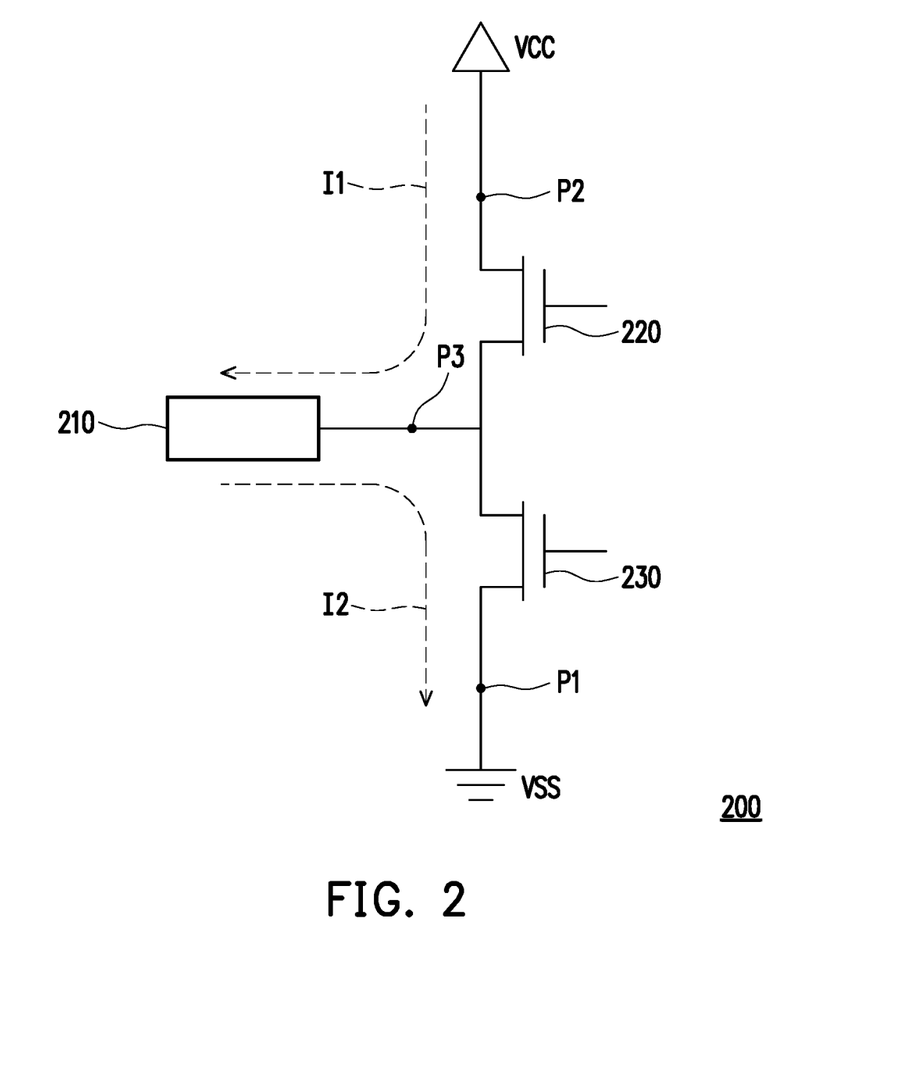
FIG. 2 is a schematic diagram illustrating a pad circuit according to an embodiment of the disclosure.

FIG. 2 is a schematic diagram illustrating a pad circuit according to an embodiment of the disclosure. Referring to FIG. 2, it is should be explain first, each of the second internal pads of the disclosure may include the pad circuit 200 as shown in FIG. 2. The pad circuit 200 may include pad unit 210, a pull-up transistor 220 and a pull-down transistor 230. A first terminal of the pull-up transistor 220 is coupled to a high level voltage VCC, and a second terminal of the pull-up transistor 220 is coupled to the pad unit 210. A first terminal of the pull-down transistor 230 is coupled to the pad unit 210 and the second terminal of the pull-up transistor 220, and a second terminal of the pull-down transistor 230 is coupled to a low level voltage VSS. A control terminal of the pull-up transistor 220 and a control terminal of the pull-down transistor 230 are respectively receive two control signals to respectively determine that the pull-up transistor 220 and the pull-down transistor 230 are operated in a turn on state or a turn off state. Specifically, when the pad circuit 200 is operated in an output state, the pull-up transistor 220 is turned on and the pull-down transistor 230 is turned off. In other word, the pad unit 210 is set to be applied with an output high level, thus an output current I1 may be transmitted from the high level voltage VCC to the pad unit 210 through the pull-up transistor 220. Moreover, when the pad circuit 200 is operated in an input state, the pull-down transistor 230 is turned on and the pull-up transistor 220 is turned off. In other word, the pad unit 210 is set to be applied with an input weakly pull low level, thus an input current I2 may be transmitted from the pad unit 210 to the low level voltage VSS through the pull-down transistor 230. The output current I1 is higher than the input current I2.

Further, the pad unit 210 is coupled to, for example, one of the third internal pads 123_1~123_N of the second circuit chip 120 of FIG. 1 through one internal trace. When the pad circuit 200 is operated in the input state, if the one trace of the pad unit 210 is not shorted with a power pad or other trace of other pad unit coupled to another one of the third internal pads 123_1~123_N, the pad circuit 200 merely transmits the input current I2 from the pad unit 210 to the low level voltage VSS through the pull-down transistor 230. However, when the pad circuit 200 is operated in the input state, if the one trace of the pad unit 210 is shorted with the power pad or other trace of other pad unit operated in the output state coupled to another one of the third internal pads 123_1~123_N, the pad unit 210 may receive an additional current (higher than the input current I2) provided by the power pad or the output current of the other pad unit operated in the output state, and transmits the additional current from the pad unit 210 to the low level voltage VSS through the pull-down transistor 230.

Furthermore, when the pad circuit 200 is operated in the output state, if the pad circuit 200 is not shorted with a ground pad, the pad circuit 200 merely transmits the output current I1 from the high level voltage VCC to the pad unit 210 through the pull-up transistor 220. However, when the pad circuit 200 is operated in the output state, if the pad circuit 200 is shorted with the ground pad, the pad unit 210 may bypass a part of the output current I1 to the ground pad, so that the pad circuit 200 merely transmits the another part of output current I1 (lower than the output current I1) from the high level voltage VCC to the pad unit 210 through the pull-up transistor 220.

Figure 3:
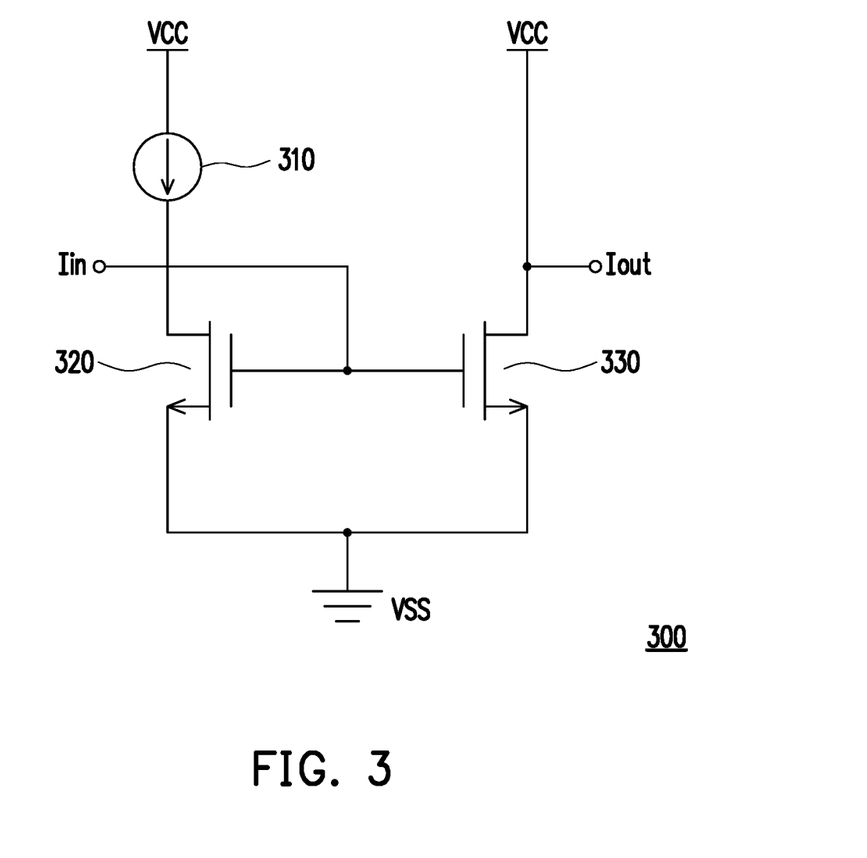
FIG. 3 is a schematic diagram illustrating a current mirror circuit according to an embodiment of the disclosure.

FIG. 3 is a schematic diagram illustrating a current mirror circuit according to an embodiment of the disclosure. Referring to FIG. 3, the current mirror circuit 113 of FIG. 1 and the current mirror circuit 413 of FIG. 4 may respectively include the current mirror circuit 300 of FIG. 3, but the disclosure is not limited thereto. The current mirror circuit 300 includes a current source 310, and two transistors 320, 330. The current source 310 is coupled between the high level voltage VCC and a first terminal of the transistor 320. The first terminal of the transistor 320 is coupled to a control terminal of the transistor 320, and a second terminal of the transistor 320 is coupled to the low level voltage VSS. A first terminal of the transistor 330 is coupled to the high level voltage VCC, and a second terminal of the transistor 330 is coupled to the low level voltage VSS. The control terminal of the transistor 320 is coupled to a control terminal of the transistor 330. The current mirror circuit 300 has a current input terminal Iin coupled to the first terminal of the transistor 320, and the current mirror circuit 300 has a current output terminal Iout coupled to the first terminal of the transistor 330. Corresponding to FIG. 1, the current input terminal Iin may be coupled to the second internal pads 112_1~112_N, and the current output terminal Iout may be coupled to the first internal pad 111_2. Corresponding to FIG. 2, the current input terminal Iin may be coupled to a circuit node P2 so as to mirror the output current I1, or the current input terminal Iin may be coupled to a circuit node P1 so as to mirror the input current I2. Therefore, the current mirror circuit 300 is capable of mirroring and summing the input currents or the output currents of the second internal pads 112_1~112_N of FIG. 1 to output a summed current or a mirror current to the first internal pad 111_2.

Referring to FIG. 1 again, based on the teaches of the above embodiments of FIG. 2 and FIG. 3, when a tester tests the integrated circuit chip 100 to determine whether the integrated circuit chip 100 has an internal trace short, a power pad short or a ground pad short, the integrated circuit chip 100 may selectively and individually operate the second internal pads 112_1~112_N in an input state or an output state, and output a current to the external pin 130_2 through the first internal pad 111_2 by the current mirror circuit 113 mirroring and summing the currents transmitted by the second internal pads 112_1~112_N. Thus, the tester can detect the current transmitted by the external pin 130_2 to determine whether the integrated circuit chip 100 is defective.

Specifically, in a trace short test, one of the second internal pads 112_1~112_N is operated in the output state, and the other of the second internal pads 112_1~112_N are operated in the input state, so that the current mirror circuit 113 mirrors and sums a plurality of input currents transmitted by the second internal pads 112_1~112_N to output a first summed current to the external pin 130_2 through the first internal pad 111_2. It is should be noted that, if one of the internal traces 140_1~140_N coupled to the one of the second internal pads 112_1~112_N is not shorted with at least another one of the internal traces 140_1~140_N coupled to at least another one of the other of the second internal pads 112_1~112_N, the first summed current is a sum of the input currents of the other of the second internal pads 112_1~112_N. However, if the one of the internal traces 140_1~140_N coupled to the one of the second internal pads 112_1~112_N is shorted with the at least another one of the internal traces 140_1~140_N coupled to at least one of the other of the second internal pads 112_1~112_N, the at least one of the second internal pads 112_1~112_N may provide an additional current higher than the above normal input current, thus the first summed current will be higher than the above normal summed current. Therefore, the tester may detect the external pin 130_2 by a test apparatus, and if the first summed current transmitted by the external pin 130_2 is greater than a first threshold current value, the test apparatus can determine that one of the internal traces 140_1~140_N coupled to the one of the second internal pads 112_1~112_N and the at least another one of the internal traces 140_1~140_N coupled to the at least one of the other of the second internal pads 112_1~112_N are shorted together. In other words, the tester may sequentially operate the second internal pads 112_1~112_N in the output state to test whether the second internal pads 112_1~112_N has the internal trace short.

In a power pad short test, the second internal pads 112_1~112_N are operated in an input state, the current mirror circuit 113 sums and mirrors a plurality of input currents transmitted by the second internal pads 112_1~112_N to output a second summed current to the external pin 130_2 through the first internal pad 111_2. It is should be noted that, if the second internal pads 112_1~112_N is not shorted with the power pad 112P, the second summed current is a sum of the input currents of the second internal pads 112_1~112_N. However, if at least one of the second internal pads 112_1~112_N is shorted with the power pad 112P, the at least one of the second internal pads 112_1~112_N may provide an additional current higher than the above normal input current, thus the second summed current will be higher than the above normal summed current. Therefore, the tester may detect the external pin 130_2 by the test apparatus, and if the second summed current transmitted by the external pin 130_2 is greater than a second threshold current value, the test apparatus can determine that at least one of the second internal pads 112_1~112_N and the power pad 112P are shorted together.

In a ground pad short test, the second internal pads 112_1~112_N are operated in an output state, the current mirror circuit 113 sums and mirrors a plurality of output currents transmitted by the second internal pads 112_1~112_N to output a third summed current to the external pin 130_2 through the first internal pad 111_2. It is should be noted that, if the second internal pads 112_1~112_N is not shorted with the ground pad 112G, the third summed current is a sum of the output currents of the second internal pads 112_1~112_N. However, if at least one of the second internal pads 112_1~112_N is shorted with the ground pad 112G, the at least one of the second internal pads 112_1~112_N may merely transmit a part of output current lower than the above normal output current, thus the third summed current will be lower than the above normal summed current. Therefore, the tester may detect the external pin 130_2 by the test apparatus, and if the third summed current transmitted by the external pin 130_2 is lower than a third threshold current value, the test apparatus can determine that at least one of the second internal pads 112_1~112_N and the ground pad 112G are shorted together.

Figure 4:
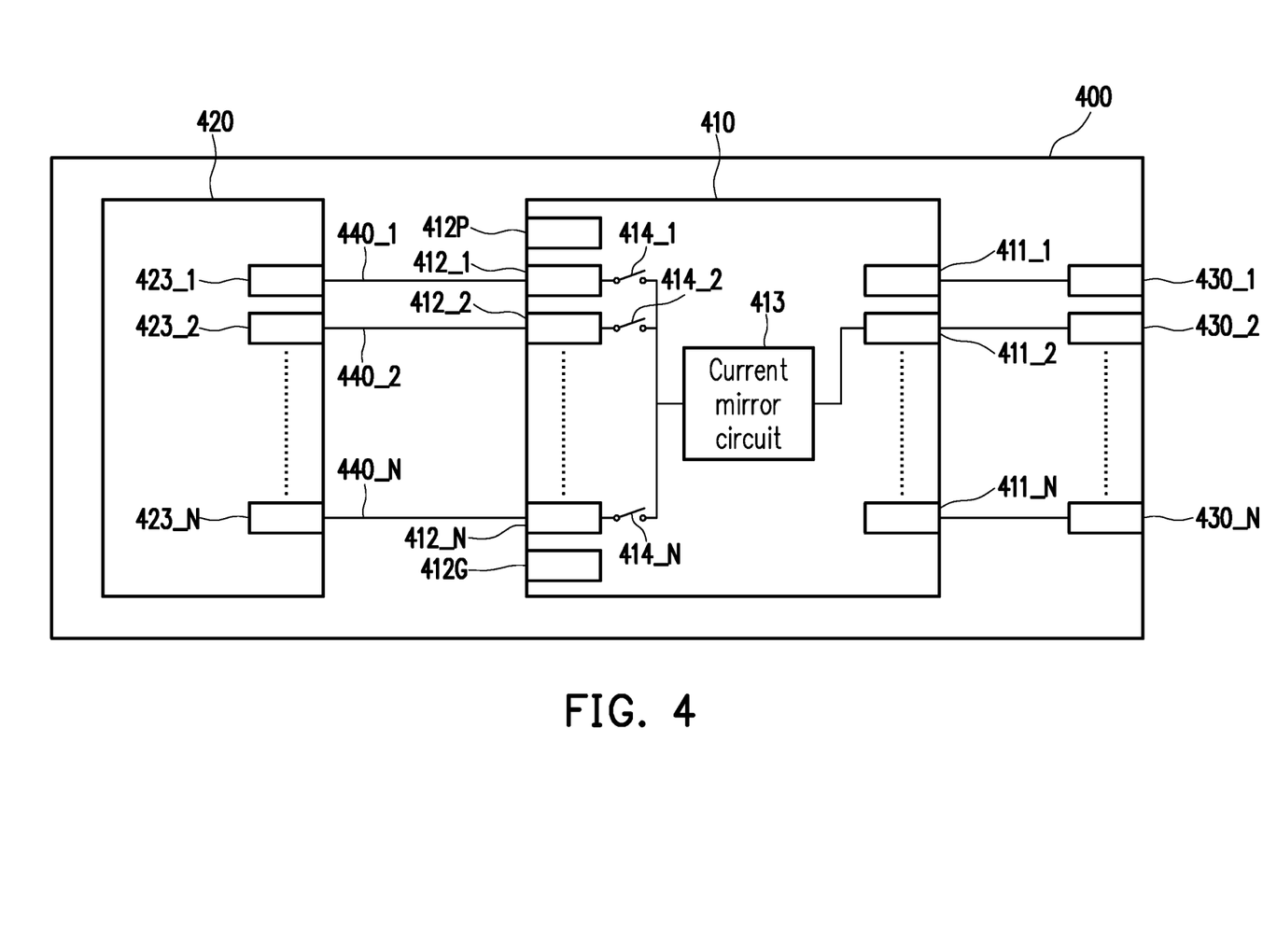
FIG. 4 is a schematic diagram illustrating an integrated circuit chip according to another embodiment of the disclosure.

FIG. 4 is a schematic diagram illustrating an integrated circuit chip according to another embodiment of the disclosure. Referring to FIG. 4, the integrated circuit chip 400 includes a first chip circuit 410, a second chip circuit 420, and a plurality of external pins 430_1~430_N. The first chip circuit 410 includes a plurality of first internal pads 411_1~411_N, a plurality of second internal pads 412_1~412_N, a power pad 412P, a ground pad 412G, a current mirror circuit 413 and a plurality of switches 414_1~414_N. In the embodiment of the disclosure, the current mirror circuit 413 is coupled to the first internal pad 411_2, but the disclosure is not limited thereto. In some embodiments of the disclosure, the current mirror circuit 413 may be coupled to at least one of the first internal pads 411_1~411_N. Comparing to the above embodiment of FIG. 1, the current mirror circuit 413 is coupled to the second internal pads 412_1~412_N through the switches 414_1~414_N. In the embodiment of the disclosure, the first internal pads 411_1~411_N are one-to-one coupled to the external pins 430_1~430_N. The second chip circuit 420 includes a plurality of third internal pads 423_1~423_N, and the second internal pads 412_1~412_N are one-to-one coupled to the third internal pads 423_1~423_N through a plurality of traces 440_1~440_N.

Based on the teaches of the above embodiments of FIG. 2 and FIG. 3, when a tester tests the integrated circuit chip 400 to determine whether a trace short, a power pad short or a ground pad short in the integrated circuit chip 400, the integrated circuit chip 400 may selectively and individually operate the second internal pads 412_1~412_N in an input state or an output state, and operate the switches 414_1~414_N in a turn on state or a turn off state, so as to output a current to the external pin 430_2 by the current mirror circuit 413 through the first internal pad 411_2 according at least one of the second internal pads 412_1~412_N. Thus, the tester can detect the current transmitted by the external pin 430_2 to determine whether the integrated circuit chip 400 is defective.

Specifically, in a trace short test, one of the second internal pads 412_1~412_N is operated in the output state, and the other of the second internal pads 412_1~412_N are operated in the input state. In the embodiment of the disclosure, one of the switches 414_1~414_N coupled to the one of the second internal pads 412_1~412_N and another one of the switches 414_1~414_N coupled to one of the other of the second internal pads 412_1~412_N are turned on, and the other of the switches 414_1~414_N are turned off. Thus, the current mirror circuit 413 mirrors an input current transmitted by the one of the second internal pads 412_1~412_N to output a first mirror current to the external pin 430_2 through the first internal pad 411_2. It is should be noted that, if two internal traces respectively coupled to the one of the second internal pads 412_1~412_N and the one of the other of the second internal pads 412_1~412_N are not shorted together, the first mirror current is equal to the input current of the other of the second internal pads 412_1~412_N. However, if the two internal traces respectively coupled to the one of the second internal pads 412_1~412_N and the one of the other of the second internal pads 412_1~412_N are shorted together, the first mirror current is higher than the input current of the other of the second internal pads 412_1~412_N. Therefore, the tester may detect the external pin 430_2 by the test apparatus, and if the first mirror current transmitted by the external pin 430_2 is greater than a fourth threshold current value, the test apparatus can determine that the two internal traces respectively coupled to the one of the second internal pads 412_1~412_N and the one of the other of the second internal pads 412_1~412_N are shorted together. In other words, the tester may sequentially turn on the other of the switches 414_1~414_N to test whether one of the traces 440_1~440_N coupled to the one of the second internal pads 412_1~412_N is shorted with the other of the traces 440_1~440_N to specifically judge the location occurring the trace short.

In a power pad short test, the second internal pads 412_1~412_N are operated in the input state. In the embodiment of the disclosure, one of the switches 414_1~414_N coupled to one of the second internal pads 412_1~412_N is turned on, and the other of the switches 414_1~414_N coupled to the other of the second internal pads 412_1~412_N are turned off. Thus, the current mirror circuit 413 mirrors an input current transmitted by the one of the second internal pads 412_1~412_N to output a second mirror current to the external pin 430_2 through the first internal pad 411_2. It is should be noted that, if the one of the second internal pads 412_1~412_N is not shorted with the power pad 412P, the second mirror current is equal to the input current of the one of the second internal pads 412_1~412_N. However, if the one of the second internal pads 412_1~412_N is shorted with the power pad 412P, the second mirror current is higher than the input current of the one of the second internal pads 412_1~412_N. Therefore, the tester may detect the external pin 430_2 by the test apparatus, and if the second mirror current transmitted by the external pin 430_2 is greater than a fifth threshold current value, the test apparatus can determine that the one of the second internal pads 412_1~412_N is shorted with the power pad 412P. In other words, the tester may sequentially turn on the other of the switches 414_1~414_N to test whether at least one of the second internal pads 412_1~412_N is shorted with the power pad 412P to specifically determine the location occurring the power pad short.

In a ground pad short test, the second internal pads 412_1~412_N are operated in the output state. In the embodiment of the disclosure, one of the switches 414_1~414_N coupled to one of the second internal pads 412_1~412_N is turned on, and the other of the switches 414_1~414_N coupled to the other of the second internal pads 412_1~412_N are turned off. Thus, the current mirror circuit 413 mirrors an output current transmitted by the one of the second internal pads 412_1~412_N to output a third mirror current to the external pin 430_2 through the first internal pad 411_2. It is should be noted that, if the one of the second internal pads 412_1~412_N is not shorted with the ground pad 412G, the third mirror current is equal to the output current of the one of the second internal pads 412_1~412_N. However, if the one of the second internal pads 412_1~412_N is shorted with the ground pad 412G, the third mirror current is lower than the output current of the one of the second internal pads 412_1~412_N. Therefore, the tester may detect the external pin 430_2 by the test apparatus, and if the third mirror current transmitted by the external pin 430_2 is lower than a sixth threshold current value, the test apparatus can determine that the one of the second internal pads 412_1~412_N is shorted with the ground pad 412G. In other words, the tester may sequentially turn on the other of the switches 414_1~414_N to test whether at least one of the second internal pads 412_1~412_N is shorted with the ground pad 412G to specifically determine the location occurring the ground pad short.

Figure 5:
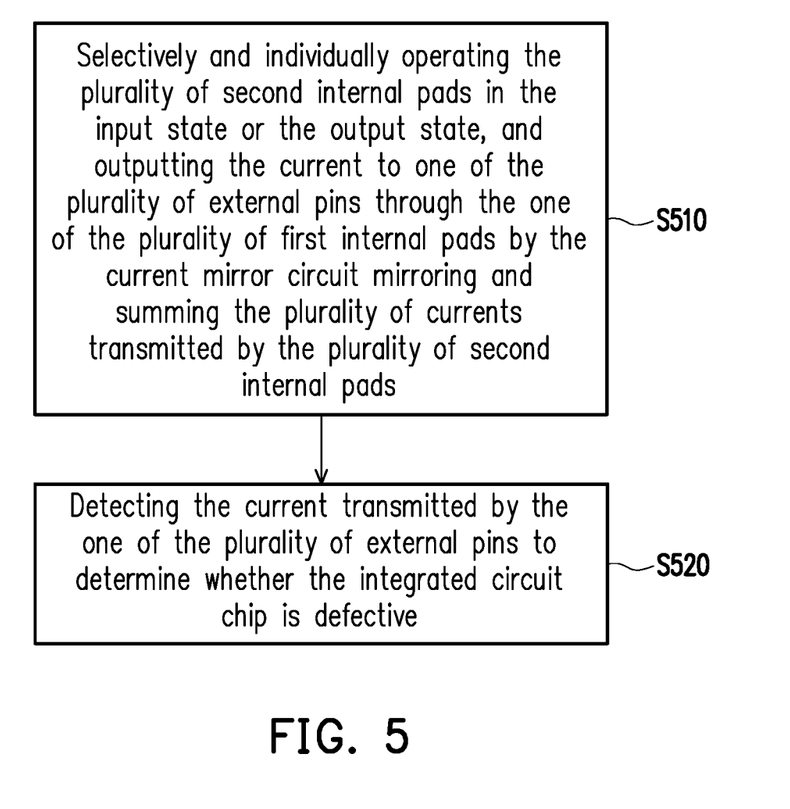
FIG. 5 is a flow chart illustrating a test method according to an embodiment of the disclosure.

FIG. 5 is a flow chart illustrating a test method according to an embodiment of the disclosure. Referring to the FIG. 1 and FIG. 5, the test method may be at least adapted to the integrated circuit chip 100 of FIG. 1. In step S510, the second internal pads 112_1~112_N are selectively and individually operated in the input state or the output state, and the current mirror circuit 113 mirrors and sums the currents transmitted by the second internal pads 112_1~112_N to output the current to one of the plurality of external pins 130_1~130_N through the one of the first internal pads 111_1~111_N. In step S520, the current transmitted by the one of the plurality of external pins 130_1~130_N is detected to determine whether the integrated circuit chip 100 is defective. Therefore, the integrated circuit chip 100 can be performed effective defect test. In addition, enough teachings and recommendations for related internal circuits of the integrated circuit chip 100, implementation details and technical features of the integrated circuit chip 100 of the embodiment may be learned from related descriptions of the embodiments of FIG. 1 to FIG. 4, and details thereof are not repeated.

Figure 6:
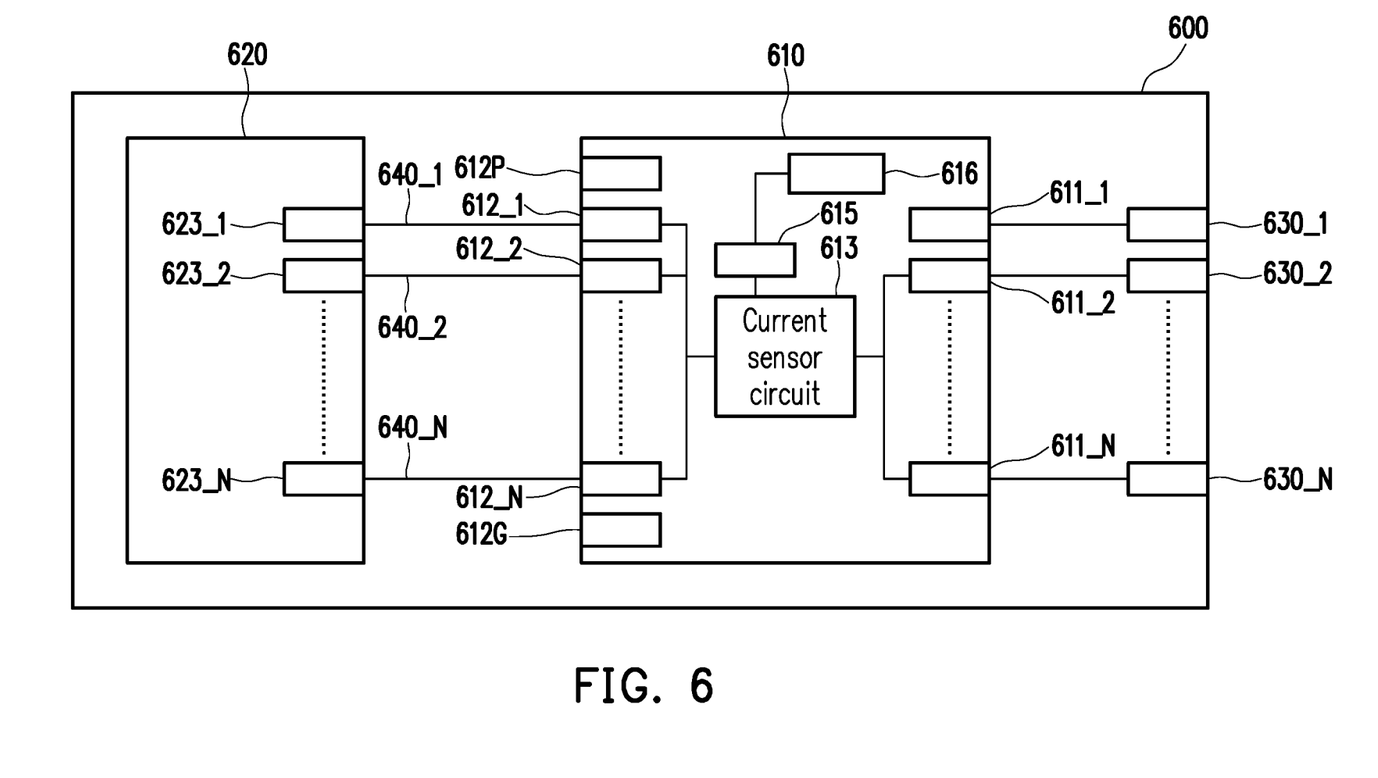
FIG. 6 is a schematic diagram illustrating an integrated circuit chip according to yet another embodiment of the disclosure.

FIG. 6 is a schematic diagram illustrating an integrated circuit chip according to yet another embodiment of the disclosure. Referring to FIG. 6, the integrated circuit chip 600 includes a first chip circuit 610, a second chip circuit 620, and a plurality of external pins 630_1~630_N. The first chip circuit 610 includes a plurality of first internal pads 611_1~611_N, a plurality of second internal pads 612_1~612_N, a power pad 612P, a ground pad 612G, a current sensor circuit 613, an analog-to-digital converter circuit 615 and a register circuit 616. In the embodiment of the disclosure, the current sensor circuit 613 is coupled to the first internal pad 611_2 and the second internal pads 612_1~612_N, but the disclosure is not limited thereto. In some embodiments of the disclosure, the current mirror circuit 613 may be coupled to at least one of the first internal pads 611_1~611_N. The analog-to-digital converter (ADC) circuit 615 is coupled to the current sensor circuit 613, and the register circuit is coupled to the analog-to-digital converter circuit 615. In the embodiment of the disclosure, the first internal pads 611_1~611_N are one-to-one coupled to the external pins 630_1~630_N. The second chip circuit 620 includes a plurality of third internal pads 623_1~623_N, and the second internal pads 612_1~612_N are one-to-one coupled to the third internal pads 623_1~623_N through a plurality of traces 640_1~640_N.

Figure 7:
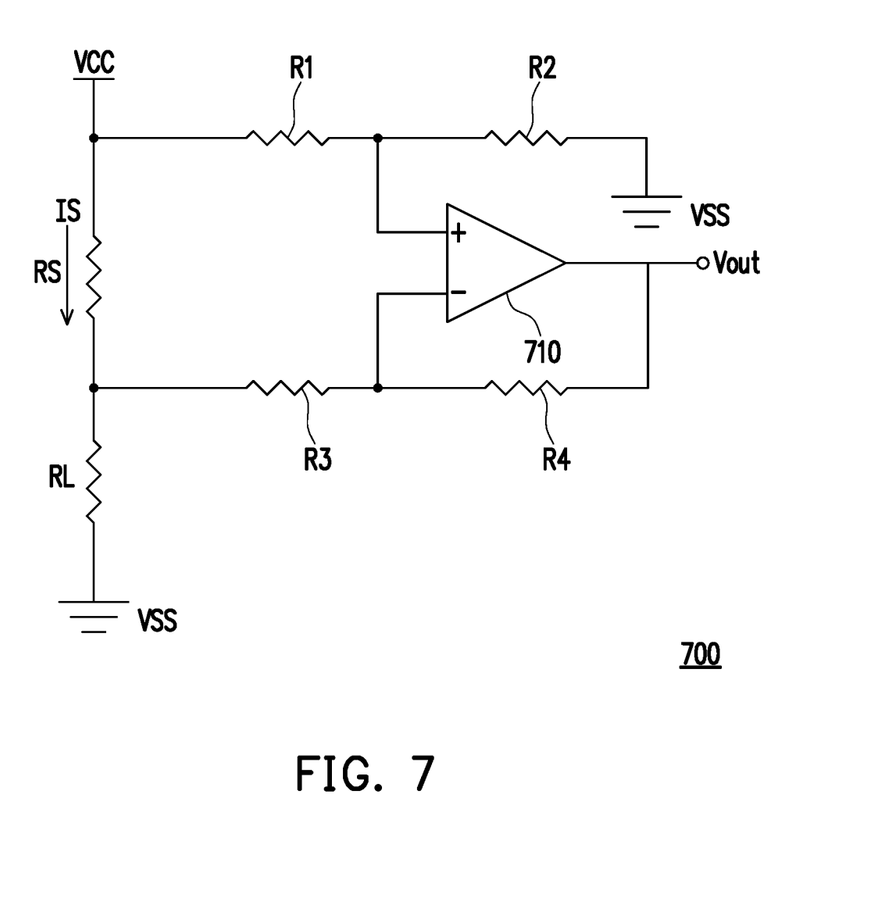
FIG. 7 is a schematic diagram illustrating a current sensor circuit according to an embodiment of the disclosure.

FIG. 7 is a schematic diagram illustrating a current sensor circuit according to an embodiment of the disclosure. Referring to FIG. 7, the current sensor circuit 700 may be a negative feedback amplifier. In the embodiment of the disclosure, the current sensor circuit 613 of FIG. 6 may include the current sensor circuit 700 of FIG. 7, but the disclosure is not limited thereto. The current sensor circuit 700 includes an amplifier 710, resistors R1~R4, a sensing resistor RS and a load resistor RL. A non-inverting input terminal of the amplifier 710 is coupled to a terminal of the resistor R1 and a terminal of the resistor R2, and an inverting input terminal of the amplifier 710 is coupled to a terminal of the resistor R3 and a terminal of the resistor R4. Another terminal of the resistor R2 is coupled to the low level voltage VSS, and another terminal of the resistor R4 is coupled to an output terminal of the amplifier 710. Another terminal or the resistor R1 is coupled to the high level voltage VCC and a terminal of the sensing resistor RS, and another terminal of the sensing resistor RS is coupled to another terminal of the resistor R3 and a terminal of the load resistor RL. Another terminal of the load resistor RL is coupled to the low level voltage VSS. Corresponding to FIG. 6, the sensing resistor RS may be coupled to the second internal pads 612_1~612_N, and the output terminal of the amplifier 710 may be coupled to the first internal pad 611_2. Corresponding to FIG. 2, the sensing resistor RS may be coupled between the pad unit 210 and a circuit node P3 in series, so as to sense the output current I1 or the input current I2. Therefore, the current sensor circuit 700 is capable of sensing and summing the input currents or the output currents of the second internal pads 612_1~612_N of FIG. 6, and outputting a sensing voltage to the first internal pad 611_2 according to a sum of the input currents or the output currents of the second internal pads 612_1~612_N of FIG. 6.

Referring to FIG. 6 again, based on the teaches of the above embodiments of FIG. 2 and FIG. 7, when the tester tests the integrated circuit chip 600 to determine whether the integrated circuit chip 600 has the trace short, the power pad short or the ground pad short, the integrated circuit chip 600 may selectively and individually operate the second internal pads 612_1~612_N in an input state or an output state, and output a current to the external pin 630_2 through the first internal pad 611_2 by the current sensor circuit 613 sensing the currents transmitted by the second internal pads 612_1~612_N. Thus, the tester can detect the current transmitted by the external pin 630_2 to determine whether the integrated circuit chip 600 is defective.

Specifically, in a trace short test, one of the second internal pads 612_1~612_N is operated in the output state, and the other of the second internal pads 612_1~612_N are operated in the input state, so that the current sensor circuit 613 senses and sums a plurality of input currents transmitted by the second internal pads 612_1~612_N to output a first sensing voltage to the external pin 630_2 through the first internal pad 611_2. It is should be noted that, if one of the internal traces 640_1~640_N coupled to the one of the second internal pads 612_1~612_N is not shorted with at least another one of the internal traces 640_1~640_N coupled to at least another one of the other of the second internal pads 612_1~612_N, the first sensing voltage is corresponded to a sum of the input currents of other of the second internal pads 612_1~612_N. However, if the one of the internal traces 640_1~640_N coupled to the one of the second internal pads 612_1~612_N is shorted with at least another one of the internal traces 640_1~640_N coupled to at least one of the other of the second internal pads 612_1~612_N, the at least one of the second internal pads 612_1~612_N may provide an additional current higher than the above normal input current, thus the first sensing voltage will be higher than the above normal sensing voltage. Therefore, the tester may detect the external pin 630_2 by a test apparatus, and if the first sensing voltage provided by the external pin 630_2 is greater than the first threshold voltage value, the test apparatus can determine that one of the internal traces 640_1~640_N coupled to the one of the second internal pads 612_1~612_N and the at least another one of the internal traces 640_1~640_N coupled to the at least one of the other of the second internal pads 612_1~612_N are shorted together. In other words, the tester may sequentially operate the second internal pads 612_1~612_N in the output state to test whether the second internal pads 612_1~612_N has the trace short.

In a power pad short test, the second internal pads 612_1~612_N are operated in an input state, the current sensor circuit 613 senses and sums a plurality of input currents transmitted by the second internal pads 612_1~612_N to output a second sensing voltage to the external pin 630_2 through the first internal pad 611_2. It is should be noted that, if the second internal pads 612_1~612_N is not shorted with the power pad 612P, the second sensing voltage is corresponded to a sum of the input currents of the second internal pads 612_1~612_N. However, if at least one of the second internal pads 612_1~612_N is shorted with the power pad 612P, the at least one of the second internal pads 612_1~612_N may provide an additional current higher than the above normal input current, thus the second sensing voltage will be higher than the above normal sensing voltage. Therefore, the tester may detect the external pin 130_2 by the test apparatus, and if the second sensing voltage provided by the external pin 130_2 is greater than a second threshold voltage value, the test apparatus can determine that at least one of the second internal pads 112_1~112_N and the power pad 112P are shorted together.

In a ground pad short test, the second internal pads 612_1~612_N are operated in an output state, the current sensor circuit 613 senses and sums a plurality of output currents transmitted by the second internal pads 612_1~612_N to output a third sensing voltage to the external pin 630_2 through the first internal pad 611_2. It is should be noted that, if the second internal pads 612_1~612_N is not shorted with the ground pad 612G, the third sensing voltage is corresponded to a sum of the output currents of the second internal pads 612_1~612_N. However, if at least one of the second internal pads 612_1~612_N is shorted with the ground pad 612G, the at least one of the second internal pads 612_1~612_N may merely transmit a part of output current lower than the above normal output current, thus the third sensing voltage will be lower than the above normal sensing voltage. Therefore, the tester may detect the external pin 630_2 by the test apparatus, and if the third sensing voltage provided by the external pin 630_2 is lower than a third threshold voltage value, the test apparatus can determine that at least one of the second internal pads 612_1~612_N and the ground pad 612G are shorted together.

In addition, in some embodiments of the disclosure, the analog-to-digital converter circuit 615 may receive an analog sensing voltage of each sensing result outputted by the current mirror circuit 613, and converts the analog sensing voltage to a sensing data. That is, the sensing data is capable of representing a current variation or a voltage variation with a high resolution. Then, the register circuit 616 stores the sensing data in to a look-up table (LUT). In other words, the tester may determine whether the integrated circuit chip is defective by checking the sensing data in the look-up table, and can accurately judge the trace short, the power pad short or the ground pad short.

Figure 8:
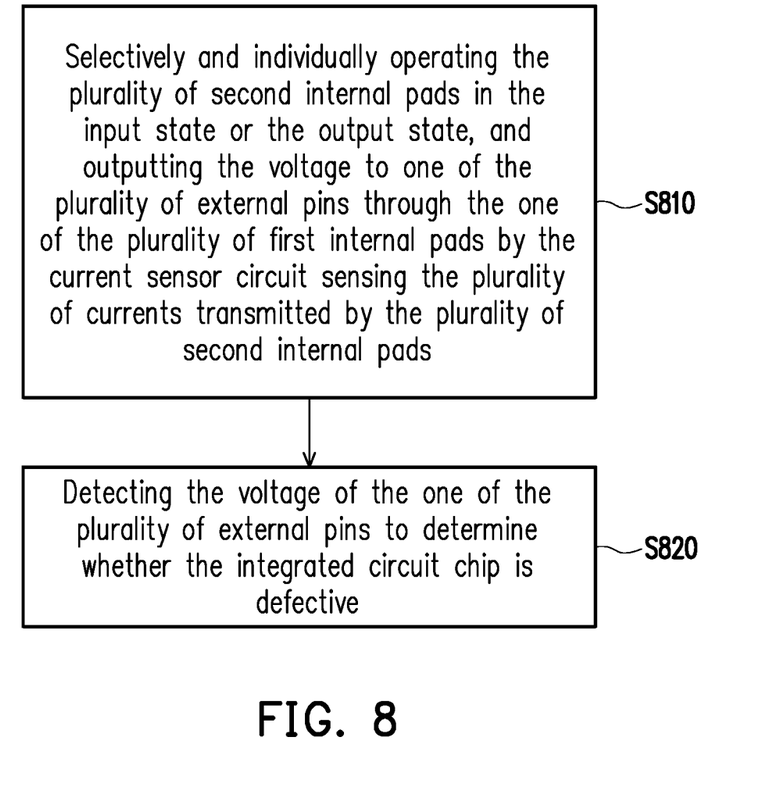
FIG. 8 is a flow chart illustrating a test method according to another embodiment of the disclosure.

FIG. 8 is a flow chart illustrating a test method according to another embodiment of the disclosure. Referring to the FIG. 6 and FIG. 8, the test method may be at least adapted to the integrated circuit chip 600 of FIG. 8. In step S810, the second internal pads 612_1~612_N are selectively and individually operated in the input state or the output state, and the current sensor circuit 613 senses the currents transmitted by the second internal pads 612_1~612_N to output the voltage to one of the plurality of external pins 630_1~630_N through the one of the first internal pads 611_1~611_N. In step S820, the voltage provided by the one of the plurality of external pins 630_1~630_N is detected to determine whether the integrated circuit chip 600 is defective. Therefore, the integrated circuit chip 600 can be performed effective defect test. In addition, enough teachings and recommendations for related internal circuits of the integrated circuit chip 100, implementation details and technical features of the integrated circuit chip 100 of the embodiment may be learned from related descriptions of the embodiments of FIG. 1 to FIG. 7, and details thereof are not repeated.

In summary, according to the integrated circuit chip and the test method thereof of the disclosure, the integrated circuit chip may selectively and individually operate the internal pads in the output state or the input state, and detect the internal pads by the current mirror circuit or the current sensor circuit to output the detecting current or the detecting voltage to one external pin. Therefore, the tester can effectively test the integrated circuit chip to determine whether the internal circuit has the trace short between the chip circuits, the power pad short or the ground pad short by detecting the one external pin.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An integrated circuit chip, comprising:
   a first chip circuit, comprising a plurality of first internal pads, a plurality of second internal pads and a current mirror circuit, wherein the current mirror circuit is coupled to one of the plurality of first internal pads and the plurality of second internal pads;
   a plurality of external pins, coupled to the plurality of first internal pads; and
   a second chip circuit, comprising a plurality of third internal pads, wherein the plurality of third internal pads are coupled to the plurality of second internal pads through a plurality of internal traces,
   wherein the current mirror circuit is configured to mirror a current transmitted between at least one of the plurality of second internal pads and at least corresponding one of the plurality of third internal pads of the second chip circuit, and generate a corresponding mirror current to the one of the plurality of first internal pads.

2. The integrated circuit chip according to the claim 1, wherein when one of the plurality of second internal pads is operated in an output state, and the other of the plurality of second internal pads are operated in an input state, the current mirror circuit mirrors and sums a plurality of input currents transmitted by the plurality of second internal pads to output a first summed current to one of the plurality of external pins through the one of the plurality of first internal pads.

3. The integrated circuit chip according to the claim 2, wherein the first chip circuit further comprises:
   a plurality of switches, respectively coupled between the plurality of second internal pads and the current mirror circuit.

4. The integrated circuit chip according to the claim 3, wherein when one of the plurality of second internal pads is operated in an output state, one of the other of the plurality of second internal pads is operated in an input state,
   wherein one of the plurality of switches coupled to the one of the plurality of second internal pads and another one of the plurality of switches coupled to the one of the other of the plurality of second internal pads are turned on, and the other of the plurality of switches are turned off,
   wherein the current mirror circuit mirrors an input current transmitted by the one of the other of the plurality of second internal pads to output a mirror current to one of the plurality of external pins through the one of the plurality of first internal pads.

5. The integrated circuit chip according to the claim 1, wherein the first chip circuit further comprises a power pad, wherein when the plurality of second internal pads are operated in an input state, the current mirror circuit mirrors and sums a plurality of input currents transmitted by the plurality of second internal pads to output a second summed current to one of the plurality of external pins through the one of the plurality of first internal pads.

6. The integrated circuit chip according to the claim 1, wherein the first chip circuit further comprises a ground pad, wherein when the plurality of second internal pads are operated in an output state, the current mirror circuit mirrors and sums a plurality of output currents transmitted by the plurality of second internal pads to output a third summed current to one of the plurality of external pins through the one of the plurality of first internal pads.

7. An integrated circuit chip, comprising:
   a first chip circuit, comprising a plurality of first internal pads, a plurality of second internal pads and a current sensor circuit, wherein the current sensor circuit is coupled to one of the plurality of first internal pads and the plurality of second internal pacts;
   a plurality of external pins, coupled to the plurality of first internal pads; and
   a second chip circuit, comprising a plurality of third internal pads, wherein the plurality of third internal pads are coupled to the plurality of second internal pads through a plurality of internal traces,
   wherein the current sensor circuit is configured to sense a current transmitted between at least one of the plurality of second internal pads and at least corresponding one of the plurality of third internal pads of the second chip circuit, and generate a corresponding sensing voltage to the one of the plurality of first internal pads.

8. The integrated circuit chip according to the claim 7, wherein when one of the plurality of second internal pads is operated in an output state, and the other of the plurality of second internal pads are operated in an input state, the current sensor circuit senses a plurality of input currents transmitted by the plurality of second internal pads to output a first sensing voltage to one of the plurality of external pins through the one of the plurality of first internal pads.

9. The integrated circuit chip according to the claim 7, wherein the first chip circuit further comprises a power pad, wherein when the plurality of second internal pads are operated in an input state, the current sensing circuit senses a plurality of input currents transmitted by the plurality of second internal pads to output a second sensing voltage to one of the plurality of external pins through the one of the plurality of first internal pads.

10. The integrated circuit chip according to the claim 7, wherein the first chip circuit further comprises a ground pad, wherein when the plurality of second internal pads are operated in an output state, the current sensor circuit senses a plurality of output currents transmitted by the plurality of second internal pads to output a third sensing voltage to one of the plurality of external pins through the one of the plurality of first internal pads.

11. The integrated circuit chip according to the claim 7, wherein the first chip circuit further comprises:
an analog-to-digital converter circuit, coupled to the current sensor circuit, and configured to convert an analog sensing voltage of a sensing result provided by the current sensor circuit to a sensing data; and
a register circuit, coupled to the analog-to-digital converter circuit, and configured to store the sensing data.

12. A test method for an integrated circuit chip, wherein the integrated circuit chip comprises a first chip circuit, a second chip circuit and a plurality of external pins, wherein a plurality of first internal pads of the first chip circuit are coupled to the plurality of external pins, the first chip circuit further comprises a plurality of second internal pads, and the second chip circuit comprises a plurality of third internal pads, wherein a current mirror circuit in the first chip circuit is coupled to one of the plurality of first internal pads and the plurality of second internal pads, wherein the test method comprises:
selectively and individually operating the plurality of second internal pads in an input state or an output state, and outputting a current to one of the plurality of external pins through the one of the plurality of first internal pads by the current mirror circuit mirroring and summing, a plurality of currents transmitted by the plurality of second internal pads; and
detecting the current transmitted by the one of the plurality of external pins to determine whether the integrated circuit chip is defective,
wherein the plurality of third internal pads are coupled to the plurality of second internal pads through a plurality of internal traces,
wherein the current mirror circuit is configured to mirror a current transmitted between at least one of the plurality of second internal pads and at least corresponding one of the plurality of third internal pads of the second chip circuit, and generate a corresponding mirror current to the one of the plurality of first internal pads.

13. The test method according to the claim 12, wherein the step of selectively and individually operating the plurality of second internal pads in the input state or the output state, and outputting the current to the one of the plurality of external pins through the one of the plurality of first internal pads by the current mirror circuit mirroring and summing the plurality of currents transmitted by the plurality of second internal pads comprises:
operating one of the plurality of second internal pads in the output state, and operating the other of the plurality of second internal pads in the input state; and
mirroring and summing a plurality of input currents transmitted by the plurality of second internal pads to output a first summed current to the one of the plurality of external pins through the one of the plurality of first internal pads,
wherein the step of detecting the current transmitted by the one of the plurality of external pins to determine whether the integrated circuit chip is defective comprises:
detecting whether the first summed current transmitted by the one of the plurality of external pins is greater than a first threshold current value to determine that one of the plurality of internal traces coupled to the one of the plurality of second internal pads and at least another one of the plurality of internal traces coupled to at least one of the other of the plurality of second internal pads are shorted together.

14. The test method according to the claim 12, wherein the integrated circuit chip further comprises a plurality of switches, and the plurality of switches are respectively coupled between the plurality of second internal pads and the current mirror circuit, wherein the step of selectively and individually operating the plurality of second internal pads in the input state or the output state, and outputting the current to the one of the plurality of external pins through the one of the plurality of first internal pads by the current mirror circuit mirroring and summing the plurality of currents transmitted by the plurality of second internal pads comprises:
operating one of the plurality of second internal pads in an output state, and operating one of the other of the plurality of second internal pads in an input state;
turning on one of the plurality of switches coupled to the one of the plurality of second internal pads and another one of the plurality of switches coupled to the one of the other of the plurality of second internal pads, and turning off the other of the plurality of switches; and
mirroring an input current transmitted by the one of the other of the plurality of second internal pads by the current mirror circuit to output a mirror current to the one of the plurality of external pins through the one of the plurality of first internal pads,
wherein the step of detecting the current transmitted by the one of the plurality of external pins to determine whether the integrated circuit chip is defective comprises:
detecting whether the mirror current transmitted by the one of the plurality of external pins is greater than a second threshold current value to determine that two internal traces respectively coupled to the one of the plurality of second internal pads and the one of the other of the plurality of second internal pads are shorted together.

15. The test method according to the claim 12, wherein the first chip circuit further comprises a power pad, and the step of selectively and individually operating the plurality of second internal pads in the input state or the output state, and outputting the current to the one of the plurality of external pins through the one of the plurality of first internal pads by the current mirror circuit mirroring and summing the plurality of currents transmitted by the plurality of second internal pads comprises:
operating the plurality of second internal pads in an input state; and
mirroring and summing a plurality of input currents transmitted by the plurality of second internal pads to output a second summed current to the one of the plurality of external pins through the one of the plurality of first internal pads, wherein the step of detecting the current transmitted by the one of the plurality of external pins to determine whether the integrated circuit chip is defective comprises:

detecting whether the second summed current transmitted by the one of the plurality of external pins is greater than a third threshold current value to determine that at least one of the plurality of second internal pads is shorted with the power pad.

16. The test method according to the claim 12, wherein the first chip circuit further comprises a ground pad, and the step of selectively and individually operating the plurality of second internal pads in the input state or the output state, and outputting the current to the one of the plurality of external pins through the one of the plurality of first internal pads by the current mirror circuit mirroring and summing the plurality of currents transmitted by the plurality of second internal pads comprises:

operating the plurality of second internal pads in an output state; and mirroring and summing a plurality of output currents transmitted by the plurality of second internal pads to output a third summed current to the one of the plurality of external pins through the one of the plurality of first internal pads, wherein the step of detecting the current transmitted by the one of the plurality of external pins to determine whether the integrated circuit chip is defective comprises:

detecting whether the third summed current transmitted by the one of the plurality of external pins is less than a fourth threshold current value to determine that at least one of the plurality of second internal pads is shorted with the ground pad.

17. A test method for an integrated circuit chip, wherein the integrated circuit chip comprises a first chip circuit, a second chip circuit and a plurality of external pins, wherein a plurality of first internal pads of the first chip circuit are coupled to the plurality of external pins, the first chip circuit further comprises a plurality of second internal pads, and the second chip circuit comprises a plurality of third internal pads, wherein a current sensor circuit in the first chip circuit is coupled to one of the plurality of first internal pads and the plurality of second internal pads, wherein the test method comprises:

selectively and individually operating the plurality of second internal pads in an input state or an output state, and outputting a voltage to one of the plurality of external pins through the one of the plurality of first internal pads by the current sensor circuit sensing a plurality of currents transmitted by the plurality of second internal pads; and detecting the voltage provided by the one of the plurality of external pins to determine whether the integrated circuit chip is defective, wherein the plurality of third internal pads are coupled to the plurality of second internal pads through a plurality of internal traces, wherein the current sensor circuit is configured to sense a current transmitted between at least one of the plurality of second internal pads and at least corresponding one of the plurality of third internal pads of the second chip circuit, and generate a corresponding sensing voltage to the one of the plurality of first internal pads.

18. The test method according to the claim 17, wherein the step of selectively and individually operating the plurality of second internal pads in the input state or the output state, and outputting the voltage to the one of the plurality of external pins through the one of the plurality of first internal pads by the current sensor circuit sensing the plurality of currents transmitted by the plurality of second internal pads comprises:

operating one of the plurality of second internal pads in an output state, and operating the other of the plurality of second internal pads in an input state; and sensing a plurality of input currents transmitted by the plurality of second internal pads to output a first sensing voltage to the one of the plurality of external pins through the one of the plurality of first internal pads, wherein the step of detecting the voltage provided by the one of the plurality of external pins to determine whether the integrated circuit chip is defective comprises:

detecting whether the first sensing voltage provided by the one of the plurality of external pins is greater than a first threshold voltage value to determine that one of the plurality of internal traces coupled to the one of the plurality of second internal pads and at least another one of the plurality of internal traces coupled to at least one of the other of the plurality of second internal pads are shorted together.

19. The test method according to the claim 17, wherein the first chip circuit further comprises a power pad, and the step of selectively and individually operating the plurality of second internal pads in the input state or the output state, and outputting the voltage to the one of the plurality of external pins through the one of the plurality of first internal pads by the current sensor circuit sensing the plurality of currents transmitted by the plurality of second internal pads comprises:

operating the plurality of second internal pads in an input state; and sensing a plurality of input currents transmitted by the plurality of second internal pads to output a second sensing voltage to the one of the plurality of external pins through the one of the plurality of first internal pads, wherein the step of detecting the voltage provided by the one of the plurality of external pins to determine whether the integrated circuit chip is defective comprises:

detecting whether the second sensing voltage provided by the one of the plurality of external pins is greater than a second threshold voltage value to determine that at least one of the plurality of second internal pads is shorted with the power pad.

20. The test method according to the claim 17, wherein the first chip circuit further comprises a ground pad, and the step of selectively and individually operating the plurality of second internal pads in the input state or the output state, and outputting the voltage to the one of the plurality of external pins through the one of the plurality of first internal pads by the current sensor circuit sensing the plurality of currents transmitted by the plurality of second internal pads comprises:

operating the plurality of second internal pads in an output state; and sensing a plurality of output currents transmitted by the plurality of second internal pads to output a third sensing voltage to the one of the plurality of external pins through the one of the plurality of first internal pads, wherein the step of detecting the voltage provided by the one of the plurality of external pins to determine whether the integrated circuit chip is defective comprises:

detecting whether the third sensing voltage provided by the one of the plurality of external pins is lower than a third threshold voltage value to determine that at least one of the plurality of second internal pads is shorted with the ground pad.

21. The test method according to the claim 17, wherein the first chip circuit further comprises an analog-to-digital converter circuit and a register circuit, and the test method comprises:
converting an analog sensing voltage of a sensing result provided by the current sensor circuit to a sensing data; and
storing the sensing data into the register circuit.

* * * * *